(12) United States Patent
Shin et al.

(10) Patent No.: US 7,283,386 B2
(45) Date of Patent: Oct. 16, 2007

(54) VOLTAGE-CONTROLLED MAGNETIZATION REVERSAL WRITING TYPE MAGNETIC RANDOM ACCESS MEMORY DEVICE AND METHOD OF WRITING AND READING INFORMATION USING THE SAME

(75) Inventors: Sung-Chul Shin, Daejeon (KR);
Jong-Ryul Jeong, Daejeon (KR);
Ravindranath Viswan, Daejeon (KR)

(73) Assignee: Korea Advanced Institute of Science and Technology (KR)

( * ) Notice: Subject to any disclaimer, the term of this patent is extended or adjusted under 35 U.S.C. 154(b) by 0 days.

(21) Appl. No.: 11/303,584

(22) Filed: Dec. 15, 2005

(65) Prior Publication Data

US 2006/0133137 A1     Jun. 22, 2006

(30) Foreign Application Priority Data

Dec. 22, 2004   (KR) ...................... 10-2004-0110458

(51) Int. Cl.
*G11C 11/00*     (2006.01)
(52) U.S. Cl. ...................................... 365/158; 365/173
(58) Field of Classification Search ................ 365/158, 365/173
See application file for complete search history.

(56) References Cited

U.S. PATENT DOCUMENTS 6,933,155 B2 *  8/2005  Albert et al. .................. 438/3
7,006,375 B2 *  2/2006  Covington .................. 365/173

OTHER PUBLICATIONS

E.B. Myers et al., SCIENCE, 285 : 867-870, 1999.
D. Chiba et al., SCIENCE, 301: 943-945, 2003.
Jeong-Won Lee et al., Applied Physics Letters, 82: 2458-2460, 2003.

* cited by examiner

*Primary Examiner*—Hoai V. Ho
(74) *Attorney, Agent, or Firm*—Bachman & LaPointe, P.C.

(57) ABSTRACT

A voltage-controlled magnetization reversal writing type Magnetic Random Access Memory (MRAM) device. The MRAM device includes electrically conductive base electrodes, a piezoelectric layer, an insulation layer, a free ferromagnetic layer, a nonmagnetic layer, a pinned ferromagnetic layer, an antiferromagnetic layer and two electrically conductive reading lines. The electrically conductive base electrodes are provided with two writing lines having positive and negative electrodes. The left and right surfaces of piezoelectric layer are disposed to abut the writing lines of the electrically conductive base electrodes, respectively. The insulation layer is disposed beneath the piezoelectric layer and is formed to separate the positive and negative electrodes. The free ferromagnetic layer is disposed on the insulation layer. The nonmagnetic layer is disposed on the free ferromagnetic layer. The pinned ferromagnetic layer is disposed on the nonmagnetic layer. The antiferromagnetic layer is disposed on the pinned ferromagnetic layer. The two electrically conductive reading lines are formed to be perpendicular to each other.

20 Claims, 6 Drawing Sheets

VOLTAGE-CONTROLLED MAGNETIZATION REVERSAL WRITING TYPE MAGNETIC RANDOM ACCESS MEMORY DEVICE AND METHOD OF WRITING AND READING INFORMATION USING THE SAME

BACKGROUND OF THE INVENTION

1. Field of the Invention

The present invention relates generally to the design of a new type of next-generation memory device, that is, a magnetic random access memory device, that uses voltage-controlled magnetization reversal and giant magnetoresistance phenomena as a method of writing and reading information to and from memory, and performs writing and reading independently of each other and, more particularly, to a nonvolatile, ultra highly-integrated and super power-saving voltage-controlled magnetization reversal writing type magnetic random access memory device and a method of writing and reading information using the magnetic random access memory device, in which voltage is uninterruptedly applied to a lead-zirconate-titanate thin film using two base electrodes composed of positive (+) and negative (−) electrodes, reading and writing are performed independently of each other using two writing lines and two reading lines, and writing is performed by applying voltage to a piezoelectric layer and controlling magnetization in a planar direction or a direction perpendicular to the planar direction using inverse magnetostriction depending on the direction of magnetization of a free ferromagnetic material.

2. Description of the Related Art

Recently, research into next-generation information storage technology has focused on the development of ultra highly-integrated, nonvolatile, low power and ultra high-speed memory, and the Magnetic Random Access Memory (MRAM) technology of a variety of next-generation memory technology is attracting attention as a new technology to satisfy both advantages of the ultra high-integration of Dynamic Random Access Memory (DRAM) and the ultra high-speed of Static Random Access Memory (SRAM).

Up to now, a variety of MRAM technologies based on Magnetic Tunnelling Junction (MJT) have been developed. These technologies are described in U.S. Pat. Nos. 6,518,588, 6,097,625, and 5,640,343.

In accordance with the above-described prior art, the writing of information is performed by changing the direction of magnetization of a magnetic layer using an externally applied magnetic field.

However, in the above-described writing scheme using an externally applied magnetic field, the localization of the magnetic field is not easy, so that there is a fundamental limitation in the development of ultra high-integrated memory.

Furthermore, since existing MRAM technology separates two ferromagnetic thin films from each other, and reads the orientations of relative spins of a magnetic thin film using the magnetoresistance effect caused by tunneling-electrons that are passed through an insulating thin film layer, a pinned layer and a free layer, the thickness of the insulating thin film layer must be about 1 nm.

This acts as a great weak point in the production of MRAM devices because it is difficult to deposit the insulating thin film, which is formed to a constant thickness of 1 nm, on a wafer having a radius of a predetermined number of inches in a production process, and because a precise work is required for the production of MRAM devices.

In writing technology for solving such a problem, the importance of technology that controls magnetization reversal using schemes other than the scheme of externally applying a magnetic field is recently increasing. For this purpose, attempts to control the direction of magnetization by applying current or electrical fields have been conducted.

E. B. Myers experimentally demonstrated current-induced magnetization reversal in a Cu/Co/Cu multilayer thin film structure. This phenomenon is interpreted as resulting from localized exchange interaction between drifting conductive electrons and spins (Myers, E. B., Ralph, D. C., Katine, J. A., Louie, R. N. and Buhrman, R. A., Current Induced Switching. of Domains in Magnetic Multilayer Devices, Science 285, 867-870, 1999).

However, in such a structure, current that is sufficiently small so as not to induce spin switching must be used for the above-described reading current because current for inducing the spin switching is generally used to measure Giant Magnetoresistance (GMR). This can act as a factor that lowers the GMR value.

One attempt to solve the problem involves controlling magnetization reversal using an electric field in a ferromagnetic semiconductor (Chilba, D., Yamanouchi, M., Matsukura, F. and Ohno, H., Electrical Manipulation of Magnetization Reversal in Ferromagnetic Semiconductor, Science 301, 943-945, 2003).

In the case of the above-described method, there is a problem in that a ferromagnetic semiconductor that can be practically used at room temperature has not been developed to date.

Meanwhile, a method of controlling magnetization reversal by applying voltage to a ferromagnetic thin film is described in US Pat. No. 2003/0103371 A1, entitled "Method of Controlling Magnetization Easy Axis in ferromagnetic Films Using Voltage, Ultra High-density, Low Power, Nonvolatile Magnetic Memory Using The Control Method, and Method of Writing Information on The Magnetic Memory." However, this method uses materials and structures that interfere with the integration of MRAM devices having existing CMOS circuits, so that there is also a problem in that the design is not suitable for ultra high speed MRAM.

SUMMARY OF THE INVENTION

Accordingly, the present invention has been made keeping in mind the above problems occurring in the prior art, and an object of the present invention is to provide a voltage-controlled magnetization reversal writing type MRAM device and a method of writing and reading information using the MRAM memory device, which allow voltage to be uninterruptedly applied to a Lead-Zirconate-Titanate (PZT) thin film using two base electrodes composed of positive (+) and negative (−) electrodes but also allows writing and reading to be performed independently of each other through the two writing lines and the two reading lines, thus improving the speed of the MRAM device and not requiring a nano-thickness tunneling barrier used in an existing MRAM device, which use materials and structures that facilitate integration with CMOS circuits, thus having excellent advantages from the points of view of the integration of MRAM devices with existing CMOS circuits, memory speed and productivity, which do not require the generation of an external magnetic field, unlike an existing external magnetic field-induced writing type MRAM device, thus enabling low power design, which improve a voltage application scheme, thus allowing an MRAM device to be more effectively manufactured, and which is applied to voltage controlled spin devices as well as memory devices, thus being applicable to the development of ultra high-density next generation memory.

In order to accomplish the above object, the present invention provides a voltage-controlled magnetization reversal writing type MRAM device, including electrically conductive base electrodes provided with two writing lines composed of positive and negative electrodes; a piezoelectric layer, the left and right surfaces of which are disposed to abut the writing lines of the electrically conductive base electrodes, respectively; a insulation layer disposed beneath the piezoelectric layer and formed to separate the positive and negative electrodes; a free ferromagnetic layer disposed on the piezoelectric layer and formed to have states of magnetization in a planar direction and a direction perpendicular to the planar direction; a nonmagnetic layer disposed on the free ferromagnetic layer; a pinned ferromagnetic layer disposed on, the nonmagnetic layer; an antiferromagnetic layer disposed on the pinned ferromagnetic layer; and two electrically conductive reading lines are formed to be perpendicular to each other, the two electrically conductive reading lines comprising a first reading line disposed on an appropriate position above the pinned ferromagnetic layer and a second reading line disposed above the positive electrode of the electrically conductive base electrodes and separated from it by an insulation layer.

The electrically conductive base electrodes are composed of a $SrRuO_3$ metallic oxide electrode layer deposited on a Si substrate.

The electrically conductive base electrodes, the insulation layer, the piezoelectric layer and the Si substrate are made of materials that minimize lattice mismatch therebetween and enable epitaxial growth.

The writing lines of the electrically conductive base electrodes are insulated by the insulation layer, and the insulation layer is disposed between the side surfaces of the writing lines.

The insulation layer is made of $SrTiO_3$.

The piezoelectric layer is made of a Lead-Zirconate-Titanate (PZT)-based material.

The piezoelectric layer is made of at least one of Lead-Lanthanum-Zirconium-Titanate (PLZT), Bismuth-Lanthanum-Titanate (BLT), and Strontium-Bismuth. Tantalate (SBT)-based materials.

The free ferromagnetic layer is made of an alloy of Co and Pd.

The free ferromagnetic layer may also be made of an alloy containing at least one selected from an A group consisting of Co, Fe, Ni and Tb, at least one selected from a B group consisting of Co, Fe, Ni and C, and at least one selected from a C group consisting of Sm, Dy and Tb.

The nonmagnetic layer is made of an alloy of Cu and Ru.

The pinned ferromagnetic layer is made of an alloy of Ni and Fe.

The pinned ferromagnetic layer may also be made of an alloy of Co and Pd.

The pinned ferromagnetic layer may also be made of an alloy containing at least one selected from an A group consisting of Co, Fe, Ni and Tb, at least one selected from a B group consisting of Co, Fe, Ni and C, and at least one selected from a C group consisting of Sm, Dy and Tb.

The pinned ferromagnetic layer is formed to be replaced with Pt and Mn, or an artificial antiferromagnetic material.

The antiferromagnetic layer is formed of an alloy thin film of Pt and Mn.

The antiferromagnetic layer may also be formed of an alloy thin film of Co and Fe.

Each of the two electrically conductive reading lines is made of Cu.

In addition, the present invention provides a method of writing information using a voltage-controlled magnetization reversal writing type MRAM device, including the step S1-1 of applying voltage to writing lines comprising a positive electrode and a negative electrode of the MRAM device; the step S1-2 of generating an electric field in a piezoelectric layer located between the writing lines; the step S1-3 of inducing the distortion of the piezoelectric layer using the electric field generated in the piezoelectric layer; the step S1-4 of changing a free ferromagnetic layer, which is disposed on the piezoelectric layer, from a horizontal magnetization state to a vertical magnetization state using the distortion induced in the piezoelectric layer; and the step S1-5 of writing variation in magnetization generated in the free ferromagnetic layer.

In the method of writing information, the writing is independently performed by the two writing lines.

In addition, the present invention provides a method of reading information using a voltage-controlled magnetization reversal writing type MRAM device, including the step S2-1 of applying current to either of two electrically conductive reading lines disposed to be perpendicular to each other; the step S2-2 of sequentially transferring the applied current to an antiferromagnetic layer, a pinned ferromagnetic layer, and a nonmagnetic layer and a free ferromagnetic layer; the step S2-3 of relatively varying resistance, which is caused by the transferred current, depending on directions of magnetization of the free ferromagnetic layer and the pinned ferromagnetic layer; and the step S2-4 of reading a magnetization state generated in the free ferromagnetic layer.

In the method of reading information, the free ferromagnetic layer and the pinned ferromagnetic layer are magnetized in a vertical or horizontal direction relative to each other, and variation in the resistance is read depending on a direction of magnetization.

In the method of reading information, the reading is independently performed by the two reading lines.

In addition, the present invention provides a method of writing and reading information using a voltage-controlled magnetization reversal writing type MRAM device, including a writing process comprising the step S1-1 of applying voltage to writing lines comprising a positive electrode and a negative electrode of the MRAM device, the step S1-2 of generating an electric field in a piezoelectric layer located between the writing lines, the step S1-3 of inducing the distortion of the piezoelectric layer using the electric field generated in the piezoelectric layer, the step S1-4 of changing a free ferromagnetic layer, which is disposed on the piezoelectric layer, from a horizontal magnetization state to a vertical magnetization state using the distortion induced in the piezoelectric layer, and the step S1-5 of writing variation in magnetization generated in the free ferromagnetic layer; and a reading process comprising the step S2-1 of applying current to either of two electrically conductive reading lines disposed to be perpendicular to each other, the step S2-2 of sequentially transferring the applied current to an antiferromagnetic layer, a pinned ferromagnetic layer, and a nonmagnetic layer and a free ferromagnetic layer, the step S2-3 of relatively varying resistance, which is caused by the transferred current, depending on the directions of magnetization of the free ferromagnetic layer and the pinned ferromagnetic layer, and the step S2-4 of reading a magnetization state generated in the free ferromagnetic layer; wherein the reading and writing are independently performed by the two writing lines and the two reading lines, respectively.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
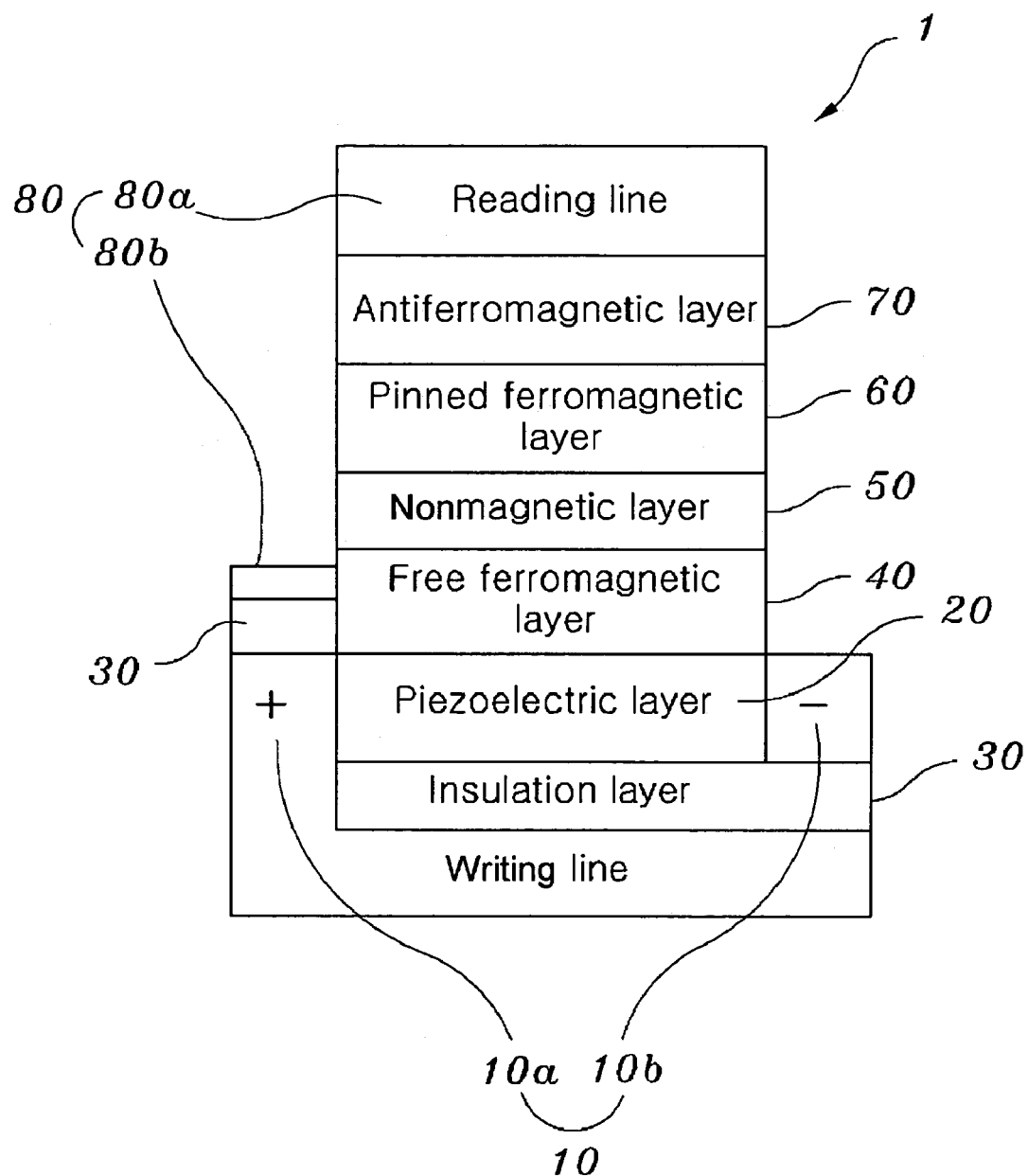
FIG. 1 is a schematic sectional view showing the ferromagnetic and piezoelectric layers of a voltage-controlled magnetization reversal writing type MRAM device in accordance with the present invention.

An embodiment of the present invention is described in detail with reference to the accompanying drawings. FIG. 1 is a schematic sectional view showing the ferromagnetic and piezoelectric layers of a voltage-controlled magnetization reversal writing type MRAM in accordance with the present invention.

As shown in FIG. 1, the voltage-controlled magnetization reversal writing type MRAM device 1 in accordance with the present invention includes a piezoelectric layer 20, an insulation layer 30, a free ferromagnetic layer 40, a nonmagnetic layer 50, a pinned ferromagnetic layer 60, an antiferromagnetic layer 70, two electrically conductive reading lines 80, and electrically conductive base electrodes 10 having positive (+) and negative (−) electrodes.

In the MRAM device 1, a $SrRuO_3$ metallic oxide electrode layer is deposited on a Si substrate, thus allowing electrically conductive base electrodes 10 to be formed of $SrRuO_3$.

The electrically conductive base electrodes 10, which are formed of $SrRuO_3$ by depositing the $SrRuO_3$ metallic oxide electrode layer on the Si substrate, has a positive (+) electrode and a negative (−) electrode. The positive (+) and negative (−) electrodes are used as writing lines 10a and 10b, respectively, when voltage is applied in a writing process, and are formed to be separated from each other by the insulation layer 30. The insulation layer 30 is made of $SrTiO_3$.

In the arrangement of MRAM devices, the positive (+) and negative (−) electrodes of the electrically conductive base electrodes 10 are formed to extend in perpendicular direction in order to connect the MRAM devices.

Meanwhile, the piezoelectric layer 20 is provided such that the polarization of charges occurs when a voltage is applied between the positive (+) and negative (−) electrodes thereby causing a strain in the piezoelectric layer 20 by the piezoelectric phenomenon. The piezoelectric layer 20 is disposed between the writing lines 10a and 10b, and both surfaces thereof come into contact with the surfaces of the writing lines 10a and 10b.

The piezoelectric layer 20 is made of a material having a high piezoelectric constant, such as PZT, and the thickness of the piezoelectric layer 20 is within a range such that maximum distortion is created at a low voltage. That is, the composition, thickness and size of the piezoelectric layer 20 are determined in a range that maximizes an inverse piezoelectric effect.

Although, in the embodiment of the present invention, the piezoelectric layer 20 is made of PZT, the piezoelectric layer 20 may also preferably be made of any one of Lead-Lanthanum-Zirconium-Titanate (PLZT), Bismuth-Lanthanum-Titanate (BLT), and Strontium-Bismuth Tantalate (SBT)-based materials.

Meanwhile, it is preferred that the materials of the electrically conductive base electrodes 10, the insulation layer 30 and the piezoelectric layer 20 be selected to minimize lattice mismatch therebetween and to enable epitaxial growth, and that materials for enabling epitaxial growth be formed on the Si substrate.

The free ferromagnetic layer 40 is called a magnetic writing layer, is formed using ferromagnetic thin films that exhibit an appropriate coercive force, a large current magnetic field and a large inverse magnetostriction effect, and is deposited on the piezoelectric layer 20.

In order to meet and satisfy the above-described conditions, a material made of an alloy of Co and Pd, that is, a $Co_x Pd_{1-x}$ thin film is employed.

Although, in the embodiment of the present invention, the free ferromagnetic layer 40 is made of an alloy of Co and Pd, it may also be made of an alloy containing at least one selected from an A group, consisting of Co, Fe, Ni and Tb, at least one selected from a B group, consisting of Co, Fe, Ni and C, and at least one selected from a C group, consisting of Sm, Dy and Tb, so that it can be made of a binary or ternary alloy, such as SmCo, TbFeCo or TbFeDy, that is composed of rare earth and transition metal.

Furthermore, the shape of the free ferromagnetic layer 40 is determined such that mutual interference caused by stray fields between neighboring writing devices can be minimized.

The nonmagnetic layer 50 is disposed on the free ferromagnetic layer 40 and is made of Cu. The composition and thickness of the free ferromagnetic layer 40 and the pinned ferromagnetic layer 60 described later, including the nonmagnetic layer 50, are formed to vary or be pinned depending on the conditions at which a GMR effect is maximized.

Although, in the embodiment of the present invention, the nonmagnetic layer 50 is made of Cu, it may be made of an alloy of Cu and Ru.

The pinned ferromagnetic layer 60 is deposited and disposed on the nonmagnetic layer 50 made of Cu, and a ferromagnetic material, such as NiFe, is used for the pinned ferromagnetic material 60.

The pinned ferromagnetic layer 60 is formed to be magnetized in a horizontal direction by the antiferromagnetic layer 70 described later, which is deposited on the pinned ferromagnetic layer 60.

Although, in the embodiment of the present invention, the pinned ferromagnetic layer 60 is made of a ferromagnetic material, such as NiFe, it may be made of an alloy of Co and Pd. Furthermore, the pinned ferromagnetic layer 60 may be made of an alloy containing at least one selected from an A group, consisting of Co, Fe, Ni and Tb, at least one selected from a B group, consisting of Co, Fe, Ni and C, and at least one selected from a C group, consisting of Sm, Dy and Tb.

Furthermore, the pinned ferromagnetic layer 60 may be formed to be replaced with Pt and Mn or an artificial antiferromagnetic material.

The antiferromagnetic layer 70 is disposed on the pinned ferromagnetic layer 60, and is formed using an alloy thin film of Pt and Mn.

Although, in the embodiment of the present invention, the antiferromagnetic layer 70 is formed to be replaced with Pt, Mn or an artificial antiferromagnetic material, it may be formed using an artificial antiferromagnetic layer, such as an alloy thin film of Co and Fe, to be spaced apart from the nonmagnetic layer 50 made of Ru.

The electrically conductive reading lines 80 are deposited and disposed on the antiferromagnetic layer 70, and are generally formed using a copper line.

The electrically conductive reading lines 80 are classified into two reading lines 80a and 80b. One of the two electrically conductive reading lines 80a and 80b, for example, the reading line 80a, is disposed and deposited on the antiferromagnetic layer 70, and the other, for example, the reading line 80b, is disposed below the antiferromagnetic layer 70 and is deposited on an insulation layer 30 above the positive (+) electrode of the base electrodes 10 used as the writing lines 10a and 10b.

As described above, one reading line 80a, deposited on the antiferromagnetic layer 70, and the other reading line 80b, deposited above the positive (+) electrode of the base electrodes 10, are perpendicular to each other and are located in different planes.

Current is passed through the two electrically conductive reading lines 80a and 80b located as described above. In detail, the current is passed through each memory device via the reading line 80a located on the antiferromagnetic layer 70 and is then passed through the reading line 80b located below the antiferromagnetic layer 70. In the arrangement of the memory devices, the reading lines 80a and 80b are formed to be selected using solid state switches, such as transistors, so that the memory devices can be read.

Figure 2A:
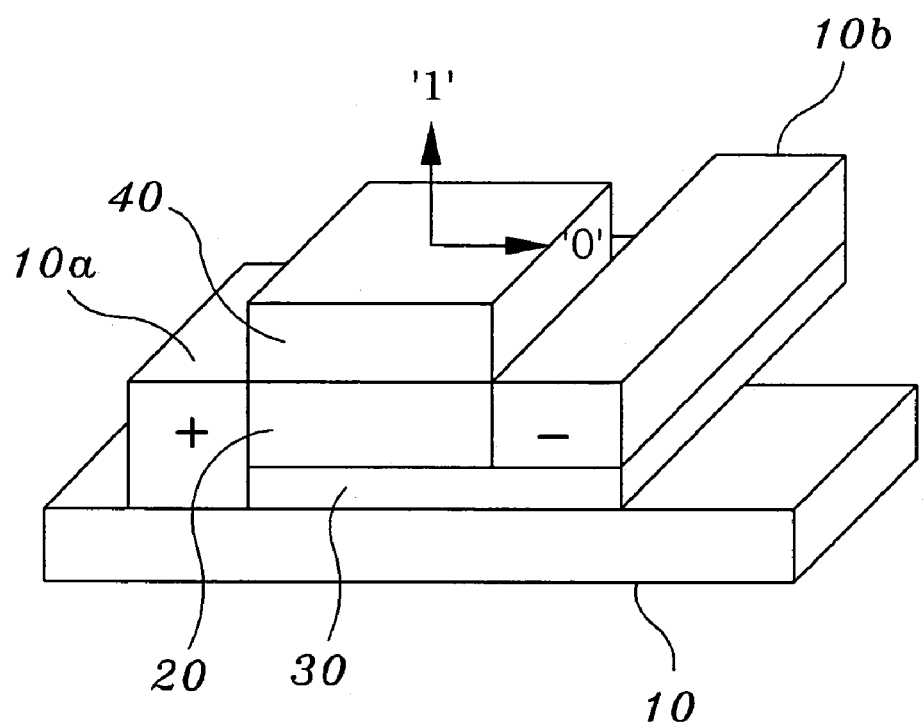
FIG. 2a is a schematic view showing the writing part of the voltage-controlled magnetization reversal writing type MRAM device in accordance with the present invention.

FIG. 2a is a schematic view showing the writing part of the voltage-controlled magnetization reversal writing type MRAM device in accordance with the present invention.

As shown in FIG. 2a, since the writing part of the voltage-controlled magnetization reversal writing type MRAM device in accordance with the present invention has been described in detail in US Pat. No. 2003/0103371 A1 referenced in the section of description of the prior art, differences between the present invention and the US Pat. No. 2003/0103371 A1 are briefly described below.

The base electrodes 10 composed of positive (+) and negative (−) electrodes are used as the writing lines 10a and 10b. The writing lines 10a and 10b are perpendicular to each other, that is, the writing lines 10a and 10b composed of the positive (+) and negative (−) electrodes are disposed in a crossed form when viewed from the top.

The writing lines 10a and 10b composed of positive (+) and negative (−) electrodes, having the above-described structure, receive a positive voltage +V and a negative voltage −V at the time of operation, respectively, and, thereby, an electrical field is generated in the piezoelectric layer 20 at the point at which the two writing lines 10a and 10b are crossed.

Distortion depending on the inverse piezoelectric effect is induced by the electric field generated in the piezoelectric layer 20 and, as the result of the distortion, the state of magnetization of the free ferromagnetic layer 40 disposed on the piezoelectric layer 20 is changed from a horizontal magnetization state into a vertical magnetization state by the inverse magnetostriction effect. The changed state is written.

That is, the piezoelectric layer 20 is distorted by the electric field generated in the piezoelectric layer 20 in which the writing lines 10a and 10b cross, and the state of magnetization of the free ferromagnetic layer 40 disposed on the distorted piezoelectric layer 20 is changed from a "0" state, which is a horizontal magnetization state, into a "1" state, which is a vertical magnetization state by the inverse magnetostriction effect. The changed state is written.

Figure 2B:
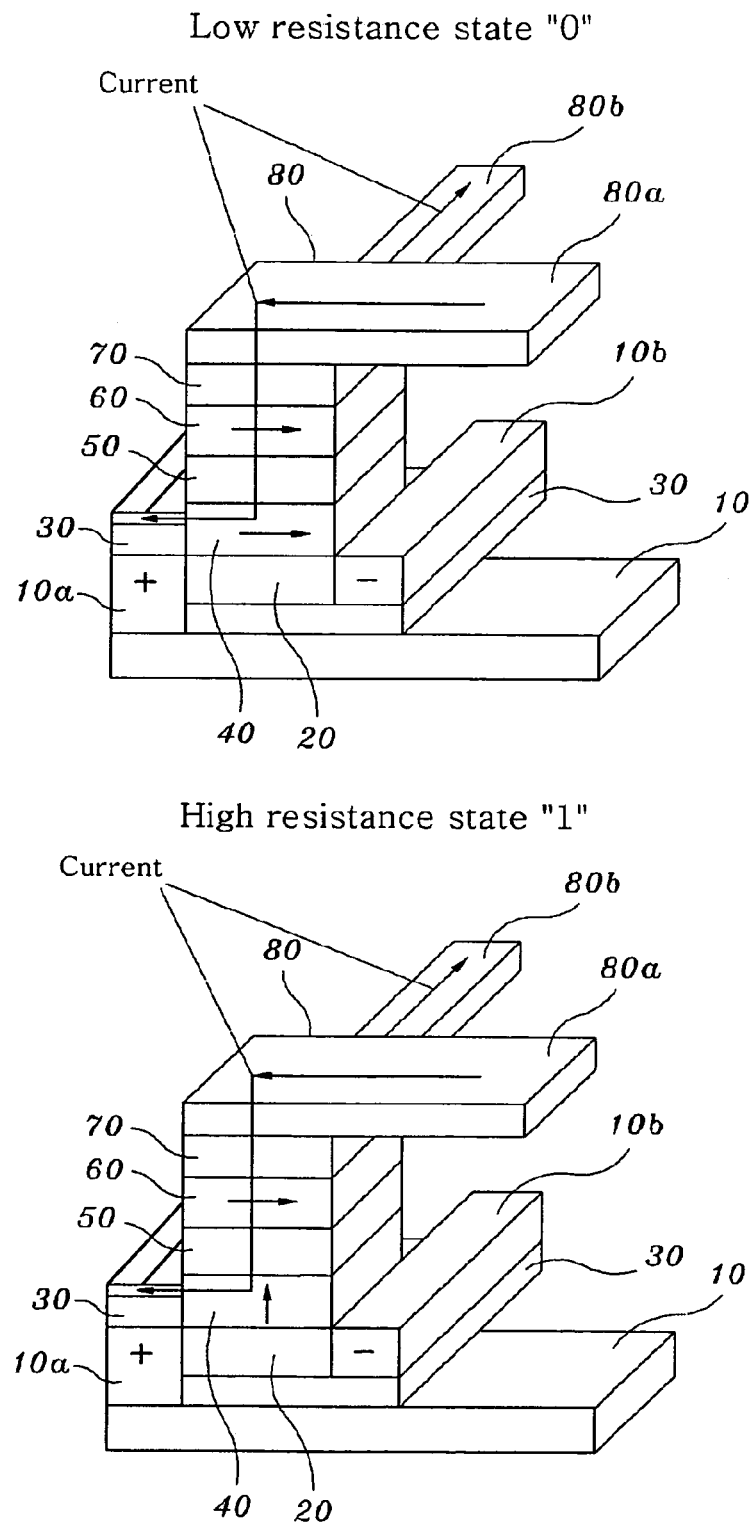
FIG. 2b is a schematic view showing the reading part of the voltage-controlled magnetization reversal writing type MRAM device in accordance with the present invention.

FIG. 2b is a schematic view showing the reading part of the voltage-controlled magnetization reversal writing type MRAM device in accordance with the present invention.

As shown in FIG. 2b, the reading part of the voltage-controlled magnetization reversal writing type MRAM device in accordance with the present invention includes the two electrically conductive reading lines 80 that are disposed perpendicular to each other, and the two electrically conductive reading lines 80 operates independently of the writing lines 10a and 10b composed of the above-described positive (+) and negative (−) electrodes.

For this purpose, the reading lines 80a and 80b are formed to be separated from each other by the writing lines 10a and 10b and the insulation layer 30.

In the above-described reading lines 80a and 80b, current is passed from either of the two reading lines 80a and 80b, for example, the reading line 80a, to the other, for example is, the reading line 80b, via the antiferromagnetic layer 70, the pinned ferromagnetic layer 60, the nonmagnetic layer 50 and the free ferromagnetic layer 40 to read the states at the time of operation of the device.

In this case, resistance that the current encounters varies with the directions of relative magnetization of the free ferromagnetic layer 40 and the pinned ferromagnetic layer 60. That is, the current encounters high resistance when the state of magnetization of the free ferromagnetic layer 40 varies in a vertical direction. In contrast, the current encounters low resistance when the magnetization state of the free ferromagnetic layer 40 varies in a horizontal direction.

In other words, the current encounters high resistance, that is, a "1" state, when the direction of magnetization of the free ferromagnetic layer 40 varies in a vertical direction. In contrast, the current encounters low resistance, that is, a "0" state, when the direction of magnetization of the free ferromagnetic layer 40 varies in a horizontal direction.

In this case, the information of the MRAM device 1 is read by the GMR effect generated as the current input through either of the electrically conductive reading lines 80, for example, the reading line 80a, is passed through the other, for example, the reading line 80b, via the components of the MRAM device 1

Figure 3:
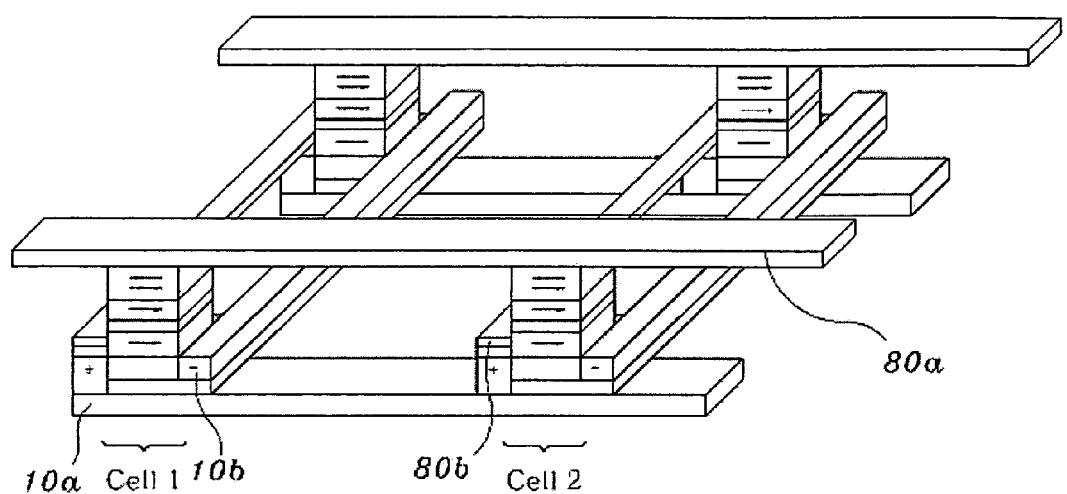
FIG. 3 is a schematic view showing the arrangement of the voltage-controlled magnetization reversal writing type MRAM device in accordance with the present invention.
Figure 4:
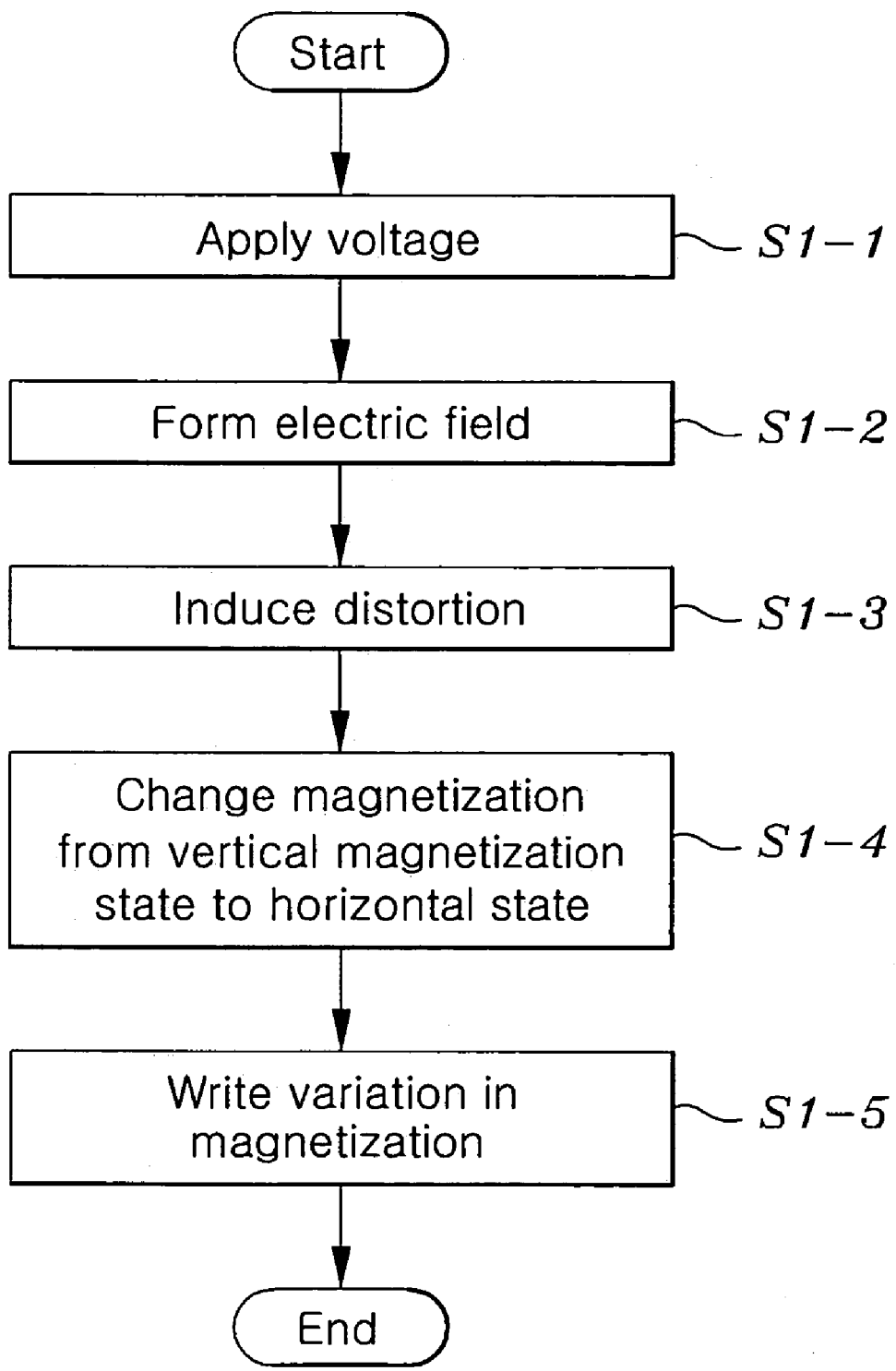
FIG. 4 is a flowchart illustrating a method of writing information using the voltage-controlled magnetization reversal writing type MRAM device in accordance with the present invention.
Figure 5:
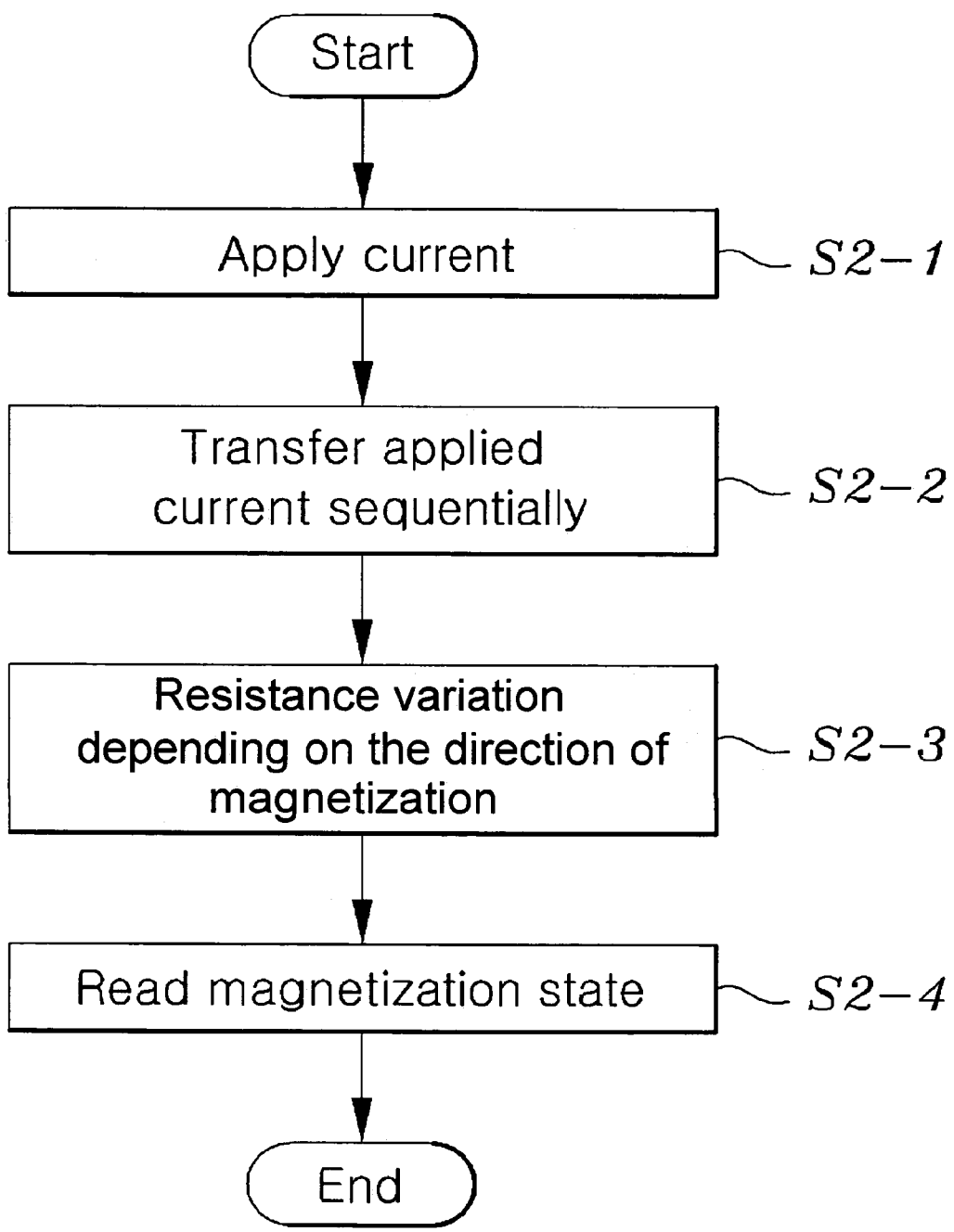
FIG. 5 is a flowchart illustrating a method of reading information using the voltage-controlled magnetization reversal writing type MRAM device in accordance with the present invention.

FIG. 3 is a schematic view showing the arrangement of the voltage-controlled magnetization reversal writing type MRAM device in accordance with the present invention, FIG. 4 is a flowchart illustrating a method of writing information using the voltage-controlled magnetization reversal writing type MRAM device in accordance with the present invention, and FIG. 5 is a flowchart illustrating a method of reading information using the voltage-controlled magnetization reversal writing type MRAM device in accordance with the present invention.

As shown in FIG. 3, the reading lines 80a and 80b and the writing lines 10a and 10b of the voltage-controlled magnetization reversal writing type MRAM device in accordance with the present invention are formed to operate independently.

Voltage is applied to the writing lines 10a and 10b composed of the positive (+) and negative (−) electrodes, so that information is written in a cell 1. In contrast, current is applied to each of the reading lines 80a and 80b, so that the written state of a cell 2 is read.

Because it has the above-described structure and construction, the MRAM device 1 can perform the writing and reading operations at the same time, so that the speed of the device can be improved, and great flexibility with respect to the writing and reading can be provided.

The method of writing and reading information using the voltage-controlled magnetization reversal writing type MRAM device in accordance with the present invention is described below.

First, the method of writing information using the voltage-controlled magnetization reversal writing type MRAM device 1 is described.

At step S1-1, the antiferromagnetic layer 70, the pinned ferromagnetic layer 60, nonmagnetic layer 50 and the free ferromagnetic layer 40 are sequentially arranged and disposed in a top-to-bottom direction, and voltage is applied to the writing lines 10a and 10b of the base electrodes 10 composed of the positive (+) and negative (−) electrodes of the MRAM device 1 in which the two base electrodes 10 are formed such that voltage is applied to piezoelectric layer 20 disposed beneath the free ferromagnetic layer 40.

At step S1-2, an electric field is generated in the piezoelectric layer 20 at the point at which the writing lines 10a and 10b cross, due to the applied voltage.

At step S1-3, the distortion of the piezoelectric layer 20 is induced by the electric field generated in the piezoelectric layer 20.

At step S1-4, the free ferromagnetic layer 40 disposed on the piezoelectric layer 20 by the distortion induced in the piezoelectric layer 20 is changed from a horizontal magnetization into a vertical magnetization.

That is, when an electric field is generated in the piezoelectric layer 20 where the writing lines 10a and 10b cross, the piezoelectric layer 20 is distorted due to the inverse piezoelectric effect, and the state of magnetization of the free ferromagnetic layer 40 disposed on the distorted piezoelectric layer 20 is changed from a horizontal magnetization state, that is, a "0" state, to a vertical magnetization state, that is, a "1" state, due to an inverse magnetostriction effect.

At step S1-5, when variation in magnetization occurs, the variation in magnetization in the free ferromagnetic layer 40 is written.

Second, the method of reading information using the voltage-controlled magnetization reversal writing type MRAM device 1 is described.

At step S2-1, current is applied to either of the two electrically conductive reading lines 80a and 80b disposed to be perpendicular to each other, for example, the reading line 80a.

At step S2-2, the current applied to either of the reading lines 80a and 80b, for example, the reading line 80a, is sequentially transferred to the antiferromagnetic layer 70, the pinned ferromagnetic layer 60, the nonmagnetic layer 50, and the free ferromagnetic layer 40.

In this case, resistance that is encountered by the transferred current varies with the directions of relative magnetization of the free ferromagnetic layer 40 and the pinned ferromagnetic layer 60.

That is, the current encounters high resistance when the magnetization state of the free ferromagnetic layer 40 varies in a vertical direction. In contrast, the current encounters low resistance when the state of magnetization of the free ferromagnetic layer 40 varies in a horizontal direction.

In other words, when the current is passed through the ferromagnetic layer 70, the pinned ferromagnetic layer 60, the nonmagnetic layer 50, and the free ferromagnetic layer 40 via either of the two electrically conductive reading lines 80a and 80b, for example, the reading line 80a disposed on an upper portion, information is read using a phenomenon in which resistance varies depending on the direction of magnetization of the free ferromagnetic layer 40. The current encounters high resistance, that is, a "1" state, when the direction of magnetization of the free ferromagnetic layer 40 varies in a vertical direction. In contrast, the current encounters low resistance, that is, a "0" state when the direction of magnetization of the free ferromagnetic layer 40 varies in a horizontal direction.

At step S2-4, the state of magnetization generated in the free ferromagnetic layer 40 is read depending on the variation in the measured resistance.

Meanwhile, it is preferable to allow variation in resistance to be read depending on the arrangement of direction of magnetization in the free ferromagnetic layer 40 and the pinned ferromagnetic layer 60, in which the direction of magnetization is vertically or horizontally arranged with respect to each other.

In the method of reading information using the voltage-controlled magnetization reversal writing type MRAM device 1 in accordance with the above-described structure and construction, the writing and reading are independently and simultaneously performed by the two writing lines 10a and 10b and the two reading lines 80a and 80b, so that the speed of the MRAM device 1 speed can increase.

As describe above, the present invention having the above described construction allows voltage to be uninterruptedly applied to a PZT thin film using two base electrodes composed of positive (+) and negative (−) electrodes but also allows writing and reading to be performed independently of each other through the two writing lines and the two reading lines, thus improving the speed of the MRAM device and not requiring a nano-thickness tunneling barrier used in an existing MRAM device. Furthermore, the present invention uses materials and structures that facilitate integration with CMOS circuits, having excellent advantages from the points of view of the integration of MRAM devices with existing CMOS circuits, memory speed and productivity. Furthermore, the present invention does not require the generation of an external magnetic field, unlike an existing external magnetic field-induced writing type MRAM device, thus enabling low power design. Furthermore, the present invention improves a voltage application scheme, thus allowing MRAM devices to be more effectively manufactured. Furthermore, the present invention may be applied to voltage controlled spin devices as well as to memory devices, thus being applicable to the development of ultra high-density next generation memory.

Although the preferred embodiment of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A voltage-controlled magnetization reversal writing type Magnetic Random Access Memory MRAM device, comprising:
    electrically conductive base electrodes provided with two writing lines composed of positive and negative electrodes;
    a piezoelectric layer, left and right surfaces of which are disposed to abut the writing lines of the electrically conductive base electrodes, respectively;
    an insulation layer disposed beneath the piezoelectric layer and formed to separate the positive and negative electrodes;
    a free ferromagnetic layer disposed on the piezoelectric layer and formed to have states of magnetization in a planar direction and a direction perpendicular to the planar direction;
    a nonmagnetic layer disposed on the free ferromagnetic layer;
    a pinned ferromagnetic layer disposed on the nonmagnetic layer;
    an antiferromagnetic layer disposed on the pinned ferromagnetic layer; and
    two electrically conductive reading lines are formed to be perpendicular to each other, the two electrically conductive reading lines comprising a first reading line disposed on an appropriate position above the pinned ferromagnetic layer and a second reading line disposed above the positive electrode of the electrically conductive base electrodes and separated from it by an insulation layer.

2. The voltage-controlled magnetization reversal writing type MRAM device as set forth in claim 1, wherein the electrically conductive base electrodes are composed of a $SrRuO_3$ metallic oxide electrode layer deposited on a Si substrate.

3. The voltage-controlled magnetization reversal writing type MRAM device as set forth in claim 1 or 2, wherein the electrically conductive base electrodes, the insulation layer, the piezoelectric layer and the Si substrate are made of materials that minimize lattice mismatch therebetween and enable epitaxial growth.

4. The voltage-controlled magnetization reversal writing type MRAM device as set forth in claim 3, wherein the writing lines of the electrically conductive base electrodes are insulated by the insulation layer, and the insulation layer is disposed between side surfaces of the writing lines.

5. The voltage-controlled magnetization reversal writing type MRAM device as set forth in claim 1, wherein the insulation layer is made of $SrTiO_3$.

6. The voltage-controlled magnetization reversal writing type MRAM device as set forth in claim 1, wherein the piezoelectric layer is made of a Lead-Zirconate-Titanate (PZT)-based material.

7. The voltage-controlled magnetization reversal writing type MRAM device as set forth in claim 1, wherein the piezoelectric layer is made of at least one of Lead-Lanthanum-Zirconium-Titanate (PLZT), Bismuth-Lanthanum-Titanate (BLT), and Strontium-Bismuth Tantalate (SBT)-based materials.

8. The voltage-controlled magnetization reversal writing type MRAM device as set forth in claim 1, wherein the free ferromagnetic layer is made of an alloy of Co and Pd.

9. The voltage-controlled magnetization reversal writing type MRAM device as set forth in claim 1, wherein the free ferromagnetic layer may also be made of an alloy containing at least one selected from an A group consisting of Co, Fe, Ni and Tb, at least one selected from a B group consisting of Co, Fe, Ni and C, and at least one selected from a C group consisting of Sm, Dy and Tb.

10. The voltage-controlled magnetization reversal writing type MRAM device as set forth in claim 1, wherein the nonmagnetic layer is made of an alloy of Cu and Ru.

11. The voltage-controlled magnetization reversal writing type MRAM device as set forth in claim 1, wherein the pinned ferromagnetic layer is made of an alloy of Ni and Fe.

12. The voltage-controlled magnetization reversal writing type MRAM device as set forth in claim 1, wherein the pinned ferromagnetic layer may also be made of an alloy of Co and Pd.

13. The voltage-controlled magnetization reversal writing type MRAM device as set forth in claim 1, wherein the pinned ferromagnetic layer may also be made of an alloy containing at least one selected from an A group consisting of Co, Fe, Ni and Tb, at least one selected from a B group consisting of Co, Fe, Ni and C, and at least one selected from a C group consisting of Sm, Dy and Tb.

14. The voltage-controlled magnetization reversal writing type MRAM device as set forth in claim 1, wherein the pinned ferromagnetic layer is formed to be replaced with Pt and Mn, or an artificial antiferromagnetic material.

15. The voltage-controlled magnetization reversal writing type MRAM device as set forth in claim 1, wherein the antiferromagnetic layer is formed of an alloy thin film of Pt and Mn.

16. The voltage-controlled magnetization reversal writing type MRAM device as set forth in claim 1, wherein the antiferromagnetic layer may also be formed of an alloy thin film of Co and Fe.

17. The voltage-controlled magnetization reversal writing type MRAM device as set forth in claim 1, wherein each of the two electrically conductive reading lines is made of Cu.

18. A method of writing information using a voltage-controlled magnetization reversal writing type MRAM device, comprising:
    the step S1-1 of applying voltage to writing lines comprising a positive electrode and a negative electrode of the MRAM device;
    the step S1-2 of generating an electric field in a piezoelectric layer located between the writing lines;
    the step S1-3 of inducing distortion of the piezoelectric layer using the electric field generated in the piezoelectric layer;
    the step S1-4 of changing a free ferromagnetic layer, which is disposed on the piezoelectric layer, from a horizontal magnetization state to a vertical magnetization state using the distortion induced in the piezoelectric layer; and
    the step S1-5 of writing variation in magnetization generated in the free ferromagnetic layer.

19. The method as set forth in claim 18, wherein the writing is independently performed by the two writing lines.

20. A method of writing and reading information using a voltage-controlled magnetization reversal writing type MRAM device, comprising:
    a writing process comprising the step S1-1 of applying voltage to writing lines comprising a positive electrode and a negative electrode of the MRAM device, the step S1-2 of generating an electric field in a piezoelectric layer located between the writing lines, the step S1-3 of inducing distortion of the piezoelectric layer using the electric field generated in the piezoelectric layer, the step S1-4 of changing a free ferromagnetic layer, which is disposed on the piezoelectric layer, from a horizontal magnetization state to a vertical magnetization state using the distortion induced in the piezoelectric layer, and the step S1-5 of writing variation in magnetization generated in the free ferromagnetic layer; and a reading process comprising the step S2-1 of applying current to either of two electrically conductive reading lines disposed to be perpendicular to each other, the step S2-2 of sequentially transferring the applied current to an antiferromagnetic layer, a pinned ferromagnetic layer, and a nonmagnetic layer and a free ferromagnetic layer, the step S2-3 of relatively varying resistance, which is caused by the transferred current, depending on directions of magnetization of the free ferromagnetic layer and the pinned ferromagnetic layer, and the step S2-4 of reading a magnetization state generated in the free ferromagnetic layer;

wherein the reading and writing are independently performed by the two writing lines and the two reading lines, respectively.

* * * * *